United States Patent
Frosien

(10) Patent No.: US 6,407,388 B1
(45) Date of Patent: Jun. 18, 2002

(54) CORPUSCULAR BEAM DEVICE

(75) Inventor: Jürgen Frosien, Riemerling (DE)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/551,003

(22) Filed: Apr. 18, 2000

(51) Int. Cl.[7] .......................... H01J 37/26; H01J 37/145
(52) U.S. Cl. ............................. 250/310; 250/396 ML; 250/306; 250/397
(58) Field of Search .................. 250/310, 396 ML, 250/306, 397

(56) References Cited

U.S. PATENT DOCUMENTS 4,812,651 A * 3/1989 Feuerbaum et al. ........ 250/310
5,412,209 A * 5/1995 Otaka et al. ................. 250/310

* cited by examiner

Primary Examiner—Bruce Anderson
Assistant Examiner—Nikita Wells
(74) Attorney, Agent, or Firm—Muramatsu & Associates

(57) ABSTRACT

The invention relates to a corpuscular beam device with an objective lens for focussing a primary particle beam onto a specimen and a detector for detecting secondary and/or backscattered particles released at the specimen. Furthermore, there is a sieve electrode arranged above the specimen which has a central hole for the primary particle beam and a plurality of additional holes for the secondary and/or backscattered particles.

11 Claims, 2 Drawing Sheets

CORPUSCULAR BEAM DEVICE

Figure 1:
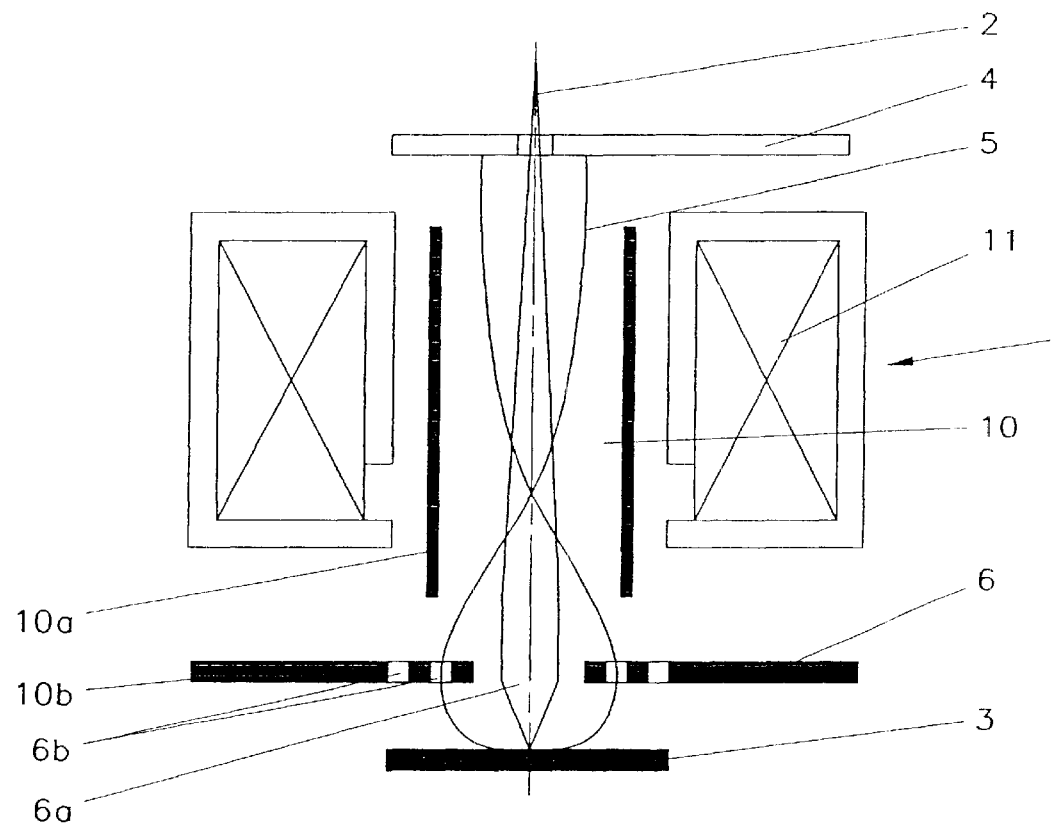

The invention relates to a corpuscular beam device with an objective lens for focussing a primary particle beam onto a specimen and a detector for detecting the secondary and/or backscattered particles released at the specimen.

High resolution objective lenses for image generation of a specimen comprise electrostatic retarding field lenses or combined electrostatic magnetic lenses. Such lenses use a higher beam energy in front of the lens and decelerate the beam to the lower final beam energy inside the objective lens. The deceleration for the primary particle beam is also used for the extraction and the acceleration of the secondary particles released at the specimen. The secondary and/or backscattered particles are transferred to detection means for registration and for forming an image of the surface of the specimen.

In high resolution lenses a high immersion ratio ($E_{in}$:$E_{out}$) is applied, since a high immersion ratio reduces the aberration of the lens, especially the spherical and the chromatic aberration. Since the retarding field is arranged in the objective lens close to the specimen, a high immersion ratio also means in conventional arrangements a strong extraction field for the secondary particles. This results in a good collection efficiency, but also generates problems when imaging insulating specimens. A strong extraction field results in a strong positive charging of the insulating surface, which makes imaging impossible or at least disrupts the imaging significantly.

To overcome this problem EP-A-0 333 018 proposes an objective lens with an additional control electrode arranged above the specimen. By applying a voltage to this control electrode, an additional field can be superimposed on the "leakage field" of the objective lens. Correspondingly, the field generated by the objective lens will be influenced and any field strength required at the specimen can be adjusted. However, if the specimen or the column is tilted, the control voltage of the control electrode causes an asymmetrical field between the specimen and the lens. This asymmetrical field affects both the primary beam (slight deflection) and the secondary beam (tilted secondary electron distribution with effects on detection efficiency).

The object of the invention, therefore, is to improve the corpuscular beam device according to the preamble to claim 1 so that it has a high electrical field inside the objective lens, a low electrical extraction field in the region of the specimen and a high secondary and/or backscattered particle detection efficiency.

This object is achieved by the features of claim 1 in that the electrode arranged above the specimen is a sieve electrode with a central hole for the primary particle beam and a plurality of additional holes for the secondary and/or backscattered particles. If the diameter of this central hole is small enough, e.g. less than 2 mm, the leakage field of the objective lens is small. By such a design surface charging can be avoided totally. Since the additional holes of the sieve electrode are also small, the extraction field can be kept small, but the detection probability using a larger number of holes can be increased significantly.

Further embodiments of the invention are the subject matter of the subordinate claims. Some embodiments of the invention and further advantages are described in the following description with reference to the drawings.

In the drawings

Figure 3:
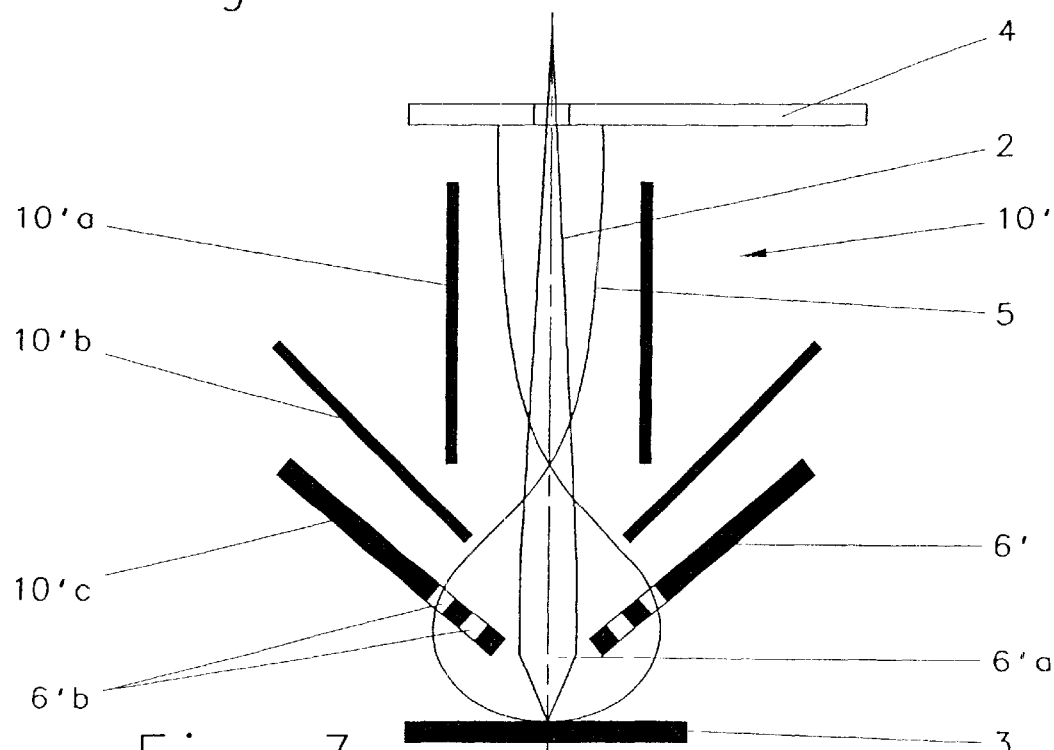
Figure 2:
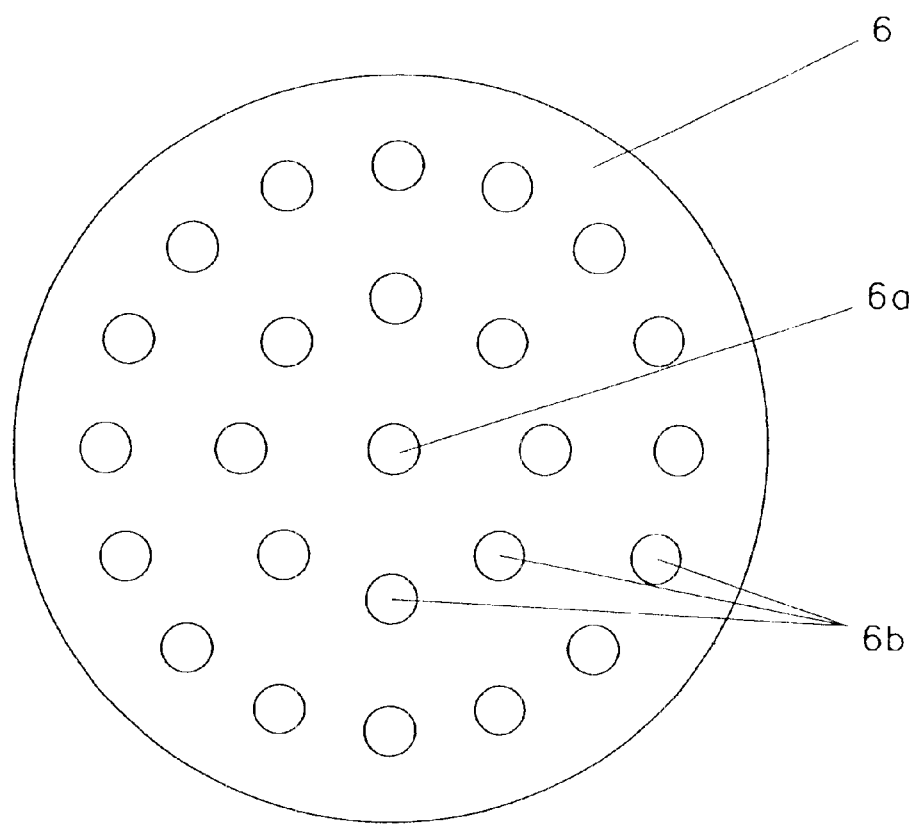

FIG. 1 shows a schematic representation of the corpuscular beam device according to a first embodiment, FIG. 2 shows a top view of the sieve lens shown in FIG. 1 and FIG. 3 shows a schematic representation of the corpuscular beam device according to a second embodiment.

The corpuscular beam device shown in FIG. 1 comprises an objective lens 1 for focussing a primary particle beam 2 onto a specimen 3 and a detector 4 for detecting secondary and/or backscattered particles 5 released at the specimen. Furthermore, there is a sieve electrode 6 which is arranged above the specimen 3. The sieve electrode has a central hole 6a for the primary particle beam 2 and a plurality of additional holes 6b for secondary and/or backscattered particles.

Preferably the primary particle beam is an electron beam which is generated by a suitable source. Furthermore the device comprises further means, e.g. condenser lens, stigmator, . . . , which are known in the art and are not disclosed in the drawings.

The objective lens 1 is a combined electrostatic magnetic lens. The electrostatic lens 10 consists of a tube electrode 10a and a second electrode 10b which is formed by the sieve electrode 6.

The magnetic lens 11 can be a pole piece lens, a single pole lens in front of or behind the specimen or any other kind of magnetic lens. The electrostatic lens 10 is preferably a retarding field lens which decelerates the primary particle beam to a final low energy.

In spite of forming a part of the electrostatic lens, the sieve lens 6 may also be arranged between the objective lens 1 and the specimen 3.

The detector 4 is arranged in front of the objective lens 1. However, an in-lens detector could also be applied.

The central hole 6a of the sieve lens 6 is made so small that the leakage field of the electrostatic lens 10 is small. The diameter should be less than 2 mm, preferably less than 1 mm. By such a design, surface charging can be avoided totally, and accordingly the drawbacks of specimen tilt will also be avoided, because no additional field is created between the lens and the specimen.

The diameter of the central hole 6b may also be less than the diameter of the primary particle beam when passing through the sieve lens. In this case a double deflection scan system has to be used having the pivot point (beam tilting point) in the central hole.

The drawback of low detection efficiency for secondary and/or backscattered particles, which is the consequence of this design, is remedied according to the invention by the arrangement of additional holes 6b in the sieve electrode. These additional holes 6b are arranged around the central hole 6a as shown in FIG. 2 and are used for secondary and/or backscattered particle detection. Since the additional holes 6b of the sieve electrode are also small, the extraction field can be kept small, but the detection probability using a larger number of holes 6b can be increased significantly. Since the retarding field of the electrostatic lens 10 also leaks through the additional hole 6b, the slow secondary particles are extracted into the objective lens and transferred to the detector 4 with high efficiency.

The holes of the sieve lens are preferably round. However, the sieve lens may be also formed by a wire mesh or other arrangements with openings.

The number and size of the holes will be adapted to the requirements.

FIG. 3 shows a second embodiment of a corpuscular beam device which differs from the device according to FIG. 1 in that the objective lens is an electrostatic retarding lens, comprising three electrodes 10'a, 10'b, 10'c. The last electrode 10'c is formed by the sieve electrode 6' which also has a central hole 6'a for the primary particle beam and additional holes 6'b for the secondary and/or backscattered particles. The sieve electrode 6' or electrode 10'c and electrode 10'b have a conical shape which improves the passing through of the secondary particles which increases the efficiency of the detection system. Furthermore, the conical shape of the sieve electrode 6' facilitates the specimen or column tilt.

The potential of the sieve electrode 6, 6' is preferably close to or at the specimen potential to overcome the limitations when tilting the specimen or column. The embodiments disclose a high resolution corpuscular beam device having

- a high electrical field inside the objective lens for achieving low aberration coefficients,
- low electrical extraction fields in front of the specimen to avoid charging of the surface of the specimen and
- high secondary and/or backscattered particle detection efficiency in spite of this low extraction field.

I claim:

1. Corpuscular beam device with
   an objective lens (1) for focussing a primary particle beam (2) onto a specimen (3),
   a detector (4) for detecting secondary and/or backscattered particles (5) released at the specimen (3) and
   an electrode arranged above the specimen for influencing the field generated by the objective lens,
   characterised in that
   said electrode is a sieve electrode (6, 6') with a central hole (6a, 6'a) for the primary particle beam (2) and a plurality of additional holes (6b, 6'b) for the secondary and/or backscattered particles (5).

2. Device according to claim 1, characterised in that the sieve electrode is arranged between the objective lens (1) and the specimen (3).

3. Device according to claim 1, characterised in that the sieve electrode (6, 6') is part of the objective lens (1).

4. Device according to claim 1, characterised in that the objective lens (1) comprises an electrostatic retarding field lens (10, 10').

5. Device according to claim 1, characterised in that the objective lens comprises an electrostatic retarding field lens (10, 10') which has at least two electrodes, wherein the sieve electrode (6, 6') is formed by the last electrode in the direction of the primary particle beam (2).

6. Device according to claim 1, characterised in that the sieve electrode (6, 6') can be supplied with a variable voltage.

7. Device according to claim 1, characterised in that the holes of the sieve electrode are round.

8. Device according to claim 1, characterised in that the diameter of the holes of the sieve electrode is less than 2 mm preferably less than 1 mm.

9. Device according to claim 1, characterised in that the central hole is positioned in the center of the sieve lens and the second holes are arranged around the central hole.

10. Device according to claim 1, characterised in that the diameter of the central hole (6a, 6'a) is less than the diameter of the primary particle beam (2) when passing through the sieve lens.

11. Device according to claim 1, characterised in that the sieve lens (6') has a conical shape.

* * * * *